(12) United States Patent
Hayashi et al.

(10) Patent No.: US 8,148,721 B2
(45) Date of Patent: Apr. 3, 2012

(54) BOTTOM GATE TYPE THIN FILM TRANSISTOR, METHOD OF MANUFACTURING THE SAME, AND DISPLAY APPARATUS

(75) Inventors: Ryo Hayashi, Yokohama (JP); Nobuyuki Kaji, Kawasaki (JP); Hisato Yabuta, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 65 days.

(21) Appl. No.: 12/515,268

(22) PCT Filed: Nov. 20, 2007

(86) PCT No.: PCT/JP2007/072878
§ 371 (c)(1),
(2), (4) Date: May 15, 2009

(87) PCT Pub. No.: WO2008/069056
PCT Pub. Date: Jun. 12, 2008

(65) Prior Publication Data
US 2010/0051936 A1    Mar. 4, 2010

(30) Foreign Application Priority Data

Dec. 5, 2006  (JP) ................................. 2006-328308
Oct. 22, 2007  (JP) ................................. 2007-273863

(51) Int. Cl.
*H01L 33/00*    (2010.01)
*H01L 29/786*   (2006.01)
*H01L 21/336*   (2006.01)

(52) U.S. Cl. ..... 257/43; 438/158; 257/59; 257/E33.053; 257/E29.291; 257/E21.414; 257/E29.068

(58) Field of Classification Search ..................... 257/43
See application file for complete search history.

(56) References Cited

U.S. PATENT DOCUMENTS
5,403,755 A    4/1995   Chae
(Continued)

FOREIGN PATENT DOCUMENTS
JP          5-335335 A    12/1993
(Continued)

OTHER PUBLICATIONS

PCT International Search Report and Written Opinion of the International Searching Authority in International Application No. PCT/JP2007/072878, Mailing Date Mar. 11, 2008.

(Continued)

*Primary Examiner* — Fernando L Toledo
*Assistant Examiner* — Robert Carpenter
(74) *Attorney, Agent, or Firm* — Fitzpatrick, Cella, Harper & Scinto

(57) ABSTRACT

Provided is a bottom gate type thin film transistor including on a substrate (1) a gate electrode (2), a first insulating film (3) as a gate insulating film, an oxide semiconductor layer (4) as a channel layer, a second insulating film (5) as a protective layer, a source electrode (6), and a drain electrode (7), in which the oxide semiconductor layer (4) includes an oxide including at least one selected from the group consisting of In, Zn, and Sn, and the second insulating film (5) includes an amorphous oxide insulator formed so as to be in contact with the oxide semiconductor layer (4) and contains therein $3.8 \times 10^{19}$ molecules/cm$^3$ or more of a desorbed gas observed as oxygen by temperature programmed desorption mass spectrometry.

10 Claims, 6 Drawing Sheets

U.S. PATENT DOCUMENTS

| | | | |
|---|---|---|---|
| 6,331,474 B1 | 12/2001 | Hayashi et al. | |
| 6,563,174 B2 | 5/2003 | Kawasaki et al. | |
| 6,794,275 B2 | 9/2004 | Kondo et al. | |
| 6,855,621 B2 | 2/2005 | Kondo et al. | |
| 6,858,308 B2 | 2/2005 | Kondo et al. | |
| 7,189,992 B2 | 3/2007 | Wager, III et al. | |
| 7,282,132 B2 | 10/2007 | Iwata et al. | |
| 7,382,421 B2 | 6/2008 | Hoffman et al. | |
| 7,501,293 B2 * | 3/2009 | Ito et al. | 438/22 |
| 2005/0275038 A1 | 12/2005 | Shih | |
| 2006/0228887 A1 | 10/2006 | Thirukkovalur | |
| 2006/0244107 A1 | 11/2006 | Sugihara et al. | |
| 2007/0090365 A1 | 4/2007 | Hayashi et al. | |
| 2007/0194379 A1 | 8/2007 | Hosono et al. | |
| 2010/0065837 A1 * | 3/2010 | Omura et al. | 257/43 |

FOREIGN PATENT DOCUMENTS

| | | |
|---|---|---|
| JP | 2002-76356 A | 3/2002 |
| JP | 2002-289859 A | 10/2002 |
| JP | 2003-228082 A | 8/2003 |
| JP | 2005-64453 A | 3/2005 |
| JP | 2006-165528 A | 6/2006 |
| WO | 2007/089048 A2 | 8/2007 |
| WO | 2007/108293 A1 | 9/2007 |
| WO | 2008/016818 A2 | 2/2008 |

OTHER PUBLICATIONS

Nomura, et al., "Room-temperature fabrication of transparent flexible thin-film transistors using amorphous oxide semiconductors", Nature, vol. 432, Nov. 25, 2004, pp. 488-492.

Nikkei Microdevices, Table 2, Feb. 2006, p. 74 (with Translation).

Suyama, et al., "High-Quality Gate-Oxide Films for Mosfet's Deposited by Oxygen-Argon Sputtering", Applied Surface Science, vol. 33/34, 1988, pp. 1236-1243.

Fujiyama, et al. "Effect of O2 gas partial pressure on mechanical properties of SiO2 films deposited by radio frequency magnetron sputtering", J. Vac. Sci. Technol. A, vol. 20, No. 2, 2002, pp. 356-361.

Nomura, et al, "Amorphous Oxide Semiconductors for High-Performance Flexible Thin-Film Transistors", Japanese Journal of Applied Physics, vol. 45, No. 5B, 2006, pp. 4303-4308.

U.S. Appl. No. 12/089,907, filed Nov. 1, 2006, Aiba, et al.

U.S. Appl. No. 12/374,665, filed Jul. 26, 2007, Itagaki, et al.

U.S. Appl. No. 12/522,371, filed Feb. 4, 2008, Yabuta, et al.

U.S. Appl. No. 12/515,267, filed Nov. 29, 2007, Omura, et al.

U.S. Appl. No. 12/534,436, filed Aug. 3, 2009, Hayashi, et al.

Taiwan IPO Search Report dated Apr. 4, 2011 issued during prosecution of related Taiwan application No. 096144280 (includes whole English-language translation).

* cited by examiner

BOTTOM GATE TYPE THIN FILM TRANSISTOR, METHOD OF MANUFACTURING THE SAME, AND DISPLAY APPARATUS

TECHNICAL FIELD

The present invention relates to a bottom gate type thin film transistor, a method of manufacturing the same, and an electro-optical apparatus such as a display apparatus. More particularly, the present invention relates to a bottom gate type thin film transistor provided with an insulating film as an etching stopper, a method of manufacturing the same, and a display apparatus.

BACKGROUND ART

In recent years, a thin film transistor (TFT) in which a transparent conductive oxide polycrystalline thin film containing ZnO as a main ingredient is used as a channel layer has been actively developed (see Japanese Patent Application Laid-Open No. 2002-76356 and U.S. Publication No. 2006/0244107 A1).

The thin film can be formed at low temperature and is transparent to visible light, so it is possible to form a flexible transparent TFT on a substrate such as a plastic plate or a film.

Further, it is disclosed that thin film transistors having a transparent semiconductor using ZnO or the like form a matrix display apparatus (U.S. Pat. No. 6,563,174).

In U.S. Pat. No. 6,563,174, it is disclosed that a source electrode and a drain electrode on an oxide semiconductor can be formed by dry etching.

According to the article in Nature, 488, 432 (2004), there is disclosed a technology of using a transparent amorphous oxide semiconductor film (a-IGZO) containing indium, gallium, zinc, and oxygen as the channel layer of a TFT.

Further, it is described that a flexible and transparent TFT with a satisfactory field-effect mobility of 6 to 9 $cm^2V^{-1} s^{-1}$ can be formed on a substrate such as a polyethylene terephthalate (PET) film at room temperature.

Further, in Table 2 on page 74 of February 2006 NIKKEI MICRODEVICES, it is described that the operation was recognized as a flexible electronic paper using a thin film transistor where a-IGZO is used as a channel layer of the TFT.

Further, as a method of forming source/drain electrodes on a semiconductor layer, a structure where an etching stopper layer is provided on a semiconductor layer in a bottom gate type thin film TFT to lower leakage current between a source electrode and a drain electrode is disclosed (U.S. Pat. No. 5,403,755 and U.S. Publication No. 2006/0054888 A1).

U.S. Pat. No. 6,563,174 discloses that, in a bottom gate type thin film TFT having a transparent oxide semiconductor whose main component is ZnO, a source electrode and a drain electrode on an oxide semiconductor can be formed by dry etching. U.S. Pat. No. 6,563,174 also describes that a protective film which is practically essential in a bottom gate type thin film TFT is formed by a plasma CVD (P-CVD) method as a silicon nitride thin film.

In most of the related art except U.S. Pat. No. 6,563,174, a source electrode and a drain electrode are formed by a lift-off technique.

In lift-off, a problem arises such as readherence of particles of a lifted-off electrode film, thus it is difficult to produce a large-area TFT with high yields.

It is difficult to form a source electrode and a drain electrode by wet etching using an acid in designing a TFT, because even if an electrode material is a metal or a transparent oxide conductor, an oxide semiconductor whose main component is ZnO is susceptible to an acid and the etching speed is high.

In effect, a source electrode and a drain electrode are formed only by a dry etching process.

However, in an oxide semiconductor whose main component is ZnO, an oxygen vacancy is liable to occur and many carrier electrons are liable to be generated, thus an oxide semiconductor layer may be damaged in a process of etching a source electrode and a drain electrode.

There is also a method of providing a protective layer as an etching stopper layer in order to decrease damage to the semiconductor layer caused by the etching, but, even if such a protective film is formed, the oxide semiconductor layer is damaged and an OFF-current becomes larger.

Thus, there is a problem in that TFT characteristics with a satisfactory on/off ratio are difficult to realize with stability.

DISCLOSURE OF THE INVENTION

Accordingly, it is an object of the present invention to attain formations of a source electrode and a drain electrode by etching in a bottom gate type thin film transistor that uses an oxide semiconductor, to thereby attain a process that excels in mass production.

Another object of the present invention is to provide a thin film transistor having satisfactory transistor characteristics with a minimized OFF-current.

In order to solve the above-mentioned problems, the present invention provides a bottom gate type thin film transistor, including on a substrate a gate electrode; a first insulating film as a gate insulating film; an oxide semiconductor layer as a channel layer; a second insulating film as a protective layer; a source electrode; and a drain electrode, in which: the oxide semiconductor layer includes an oxide including at least one selected from the group consisting of In, Zn, and Sn; and the second insulating film includes an amorphous oxide insulator formed so as to be in contact with the oxide semiconductor layer and contains therein $3.8 \times 10^{19}$ molecules/$cm^3$ or more of a desorbed gas observed as oxygen by temperature programmed desorption mass spectrometry. The temperature programmed desorption mass spectrometry (TPD) is also known as thermal desorption spectroscopy (TDS).

Further, the present invention provides a method of manufacturing a bottom gate type thin film transistor, the bottom gate type thin film transistor including on a substrate a gate electrode, a first insulating film as a gate insulating film, an oxide semiconductor layer as a channel layer, a second insulating film as a protective layer, a source electrode, and a drain electrode, the method including: forming the gate electrode on the substrate; forming the first insulating film and the oxide semiconductor layer in the stated order; patterning the first insulating film and the oxide semiconductor layer; forming the second insulating film in an atmosphere including an oxidizing gas; patterning the second insulating film so as to cover a channel region (at least a part of a channel region) of the oxide semiconductor layer; forming the source electrode and the drain electrode; and patterning the source electrode and the drain electrode using the second insulating film as an etching stopper.

According to the present invention, the source electrode and a drain electrode can be formed by etching, which makes it possible to provide thin film transistors which are excellent in mass productivity and have such transistor characteristics has to have a minimized OFF-current.

Further features of the present invention will become apparent from the following description of exemplary embodiments with reference to the attached drawings.

BEST MODE FOR CARRYING OUT THE INVENTION

Best mode for carrying out the present invention will be described in the following with reference to the attached drawings.

In a thin film transistor (TFT) of this embodiment, amorphous $SiO_x$ is used as a gate insulating film material. It is also possible to form by sputtering an $Al_2O_3$ and a-$SiO_xN_y$, which are amorphous oxide insulators.

It is preferable to use ZnO or an oxide semiconductor containing In, Zn, and O as a channel layer of the thin film transistor.

The channel layer contains In, Zn, O, and besides, at least one of Ga, Al, Fe, Sn, Mg, Ca, Si, and Ge. Further, it is preferable to use an amorphous oxide whose conductivity is between $10^{-3}$ S/cm or more and $10^{-7}$ S/cm or less.

Figure 1:
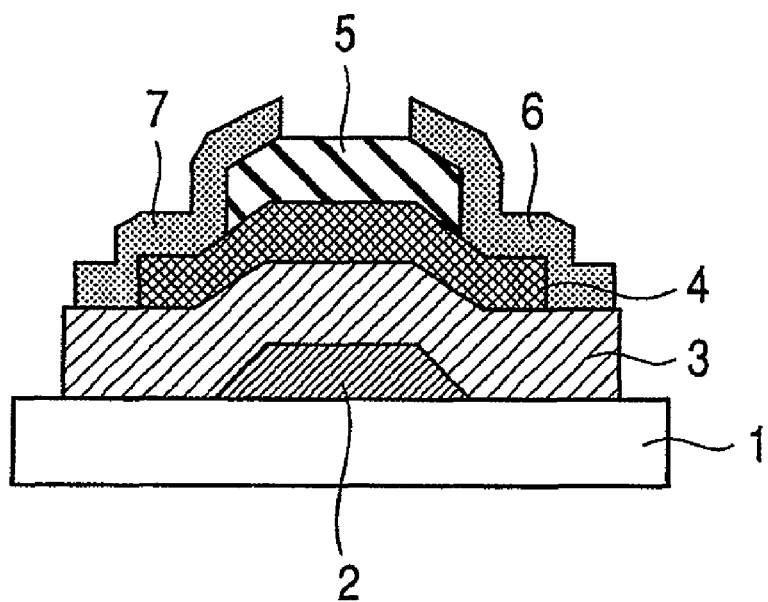
FIG. 1 is a view illustrating a structure of an inverted stagger type TFT having a second insulating film which functions as an etching stopper.

FIG. 1 is a sectional view, as an example of a thin film transistor, illustrating a structure of a bottom gate structure where a protective film functions as an etching stopper.

A gate electrode 2 is provided on a substrate 1, and further, a first insulating film 3, an oxide semiconductor layer 4 as a channel layer, a second insulating film 5, a source electrode 6, and a drain electrode 7 are provided thereon.

When an amorphous oxide containing In, Zn, and O is used as the oxide semiconductor layer 4, it can be produced at room temperature, and thus, if the insulating film is formed by sputtering, all the film forming processes can be performed at room temperature. Further, as the substrate, a plastic substrate, a plastic film, or the like can be used.

The oxide semiconductor layer 4 is patterned to form a channel region. After that, an amorphous oxide insulating layer, which is the second insulating film 5, is formed in an atmosphere containing an oxidizing gas.

By forming the second insulating film 5 which is a protective layer such that the resistance of the oxide semiconductor does not become low, generation of an oxygen vacancy in the oxide semiconductor whose main component is ZnO is suppressed, and thus, generation of many carrier electrons and a large OFF-current can be prevented.

After the second insulating film 5 is patterned by dry etching using a $CF_4$ gas, a transparent conductive oxide film of ITO, IZO, or the like as the source electrode 6 and the drain electrode 7 is formed.

The second insulating film which functions as an etching stop layer protects the channel region, and thus the source electrode and the drain electrode can be patterned not only by dry etching but also by wet etching.

Ideally, it is preferable that the second insulating film covers the entire channel region in view of the protection of the source electrode and the drain electrode upon etching. However, when damages to the second insulating film do not substantially lower the characteristics so much according to the etching conditions or the etching time, it is not necessary to provide the second insulating film so as to cover the entire channel region. In this case, the second insulating film may be so provided as to cover part of the channel region.

As the source electrode and the drain electrode, a metal such as Ni, Cr, Rh, Mo, Nd, Ti, W, Ta, Pb, or Al, an alloy thereof, or a silicide thereof may be used.

Figure 2:
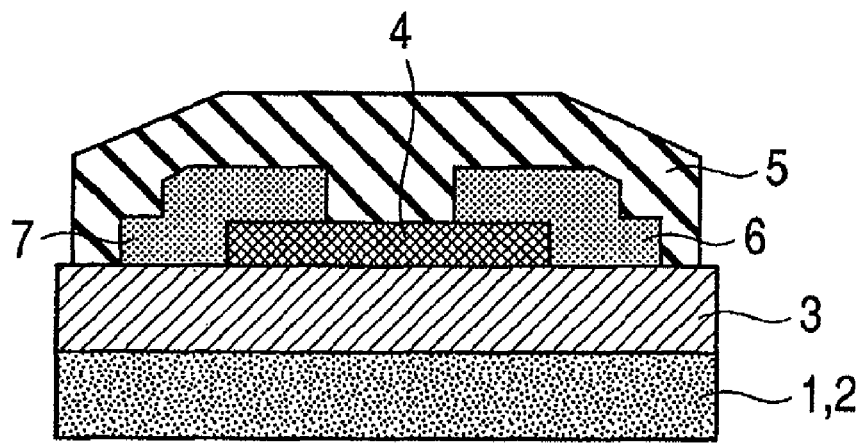
FIG. 2 is a view illustrating a structure of an inverted stagger type TFT using a thermal oxide film silicon gate insulating film on a low resistance n-type silicon substrate.

FIG. 2 illustrates a structure of a bottom gate inverted stagger type TFT using a thermal oxide silicon insulating film 2 with a low resistance n-type crystalline silicon being a gate electrode and a substrate 1.

The influence of the conditions under which the second insulating film is formed on TFT characteristics when an oxide semiconductor is used is examined using the structure illustrated in FIG. 2.

Amorphous InGaZnO was formed as the oxide semiconductor 4. The source electrode 6 and the drain electrode 7 were formed by depositing as a laminated structure of Ti/Au/Ti followed by lift-off.

When there is no second insulating film, a TFT:A was completed here.

After that, with amorphous $SiO_x$ to be a second insulating film being a target, $SiO_2$ and a 100%-Ar gas as a sputtering gas were used to form 100 nm amorphous $SiO_x$ by sputtering.

By forming a contact hole by wet etching on the source electrode 6 and the drain electrode 7, a TFT:B having the second insulating film was completed.

Figure 3:
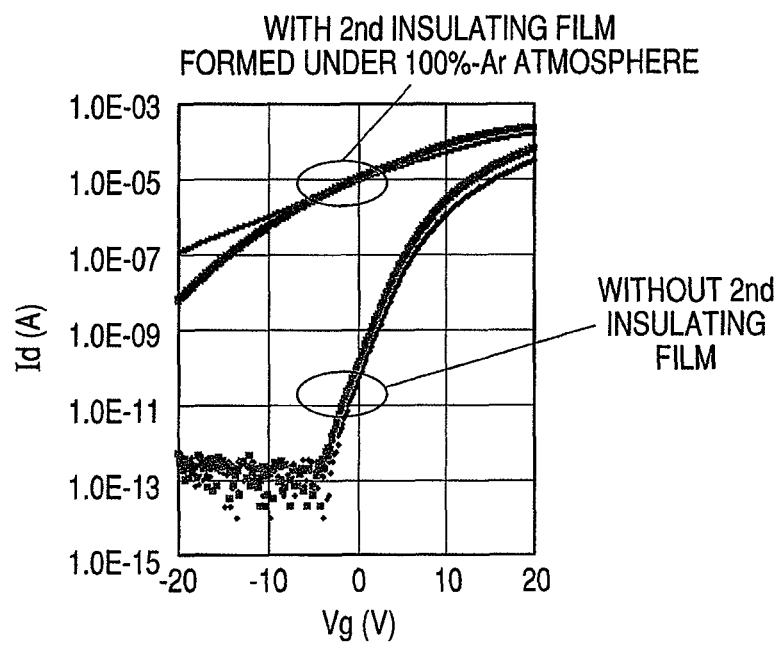
FIG. 3 is a graph illustrating typical current-voltage characteristics when the inverted stagger type TFT illustrated in FIG. 2 is produced.

FIG. 3 is a graph illustrating typical current-voltage characteristics of the TFT:A and the TFT:B produced in the above-described method.

With regard to the TFT:A, TFT characteristics with a satisfactory on/off ratio and with a minimized OFF-current are shown. However, with regard to the TFT:B where amorphous $SiO_x$ that is thought to be an ordinary oxide film insulating layer was formed as the second insulating film, an OFF-current is not exhibited even when the gate voltage is −20 V.

The reason is thought to be reduction of the oxide semiconductor layer or generation of an oxygen vacancy in the oxide semiconductor layer when the second insulating film was formed.

This is because, in an oxide semiconductor whose main component is ZnO, an oxygen vacancy is liable to occur and many carrier electrons are liable to be generated.

In FIG. 3, a result of using sputtering for forming the second insulating film is illustrated. When amorphous $SiO_x$ or amorphous $SiN_y$ is formed by P-CVD as the second insulating film, the on/off ratio is still less satisfactory.

As a result, in effect, the TFT does not operate as a TFT.

This implies that because an oxide semiconductor is extremely sensitive to hydrogen, the resistance of a portion of the oxide semiconductor that is in contact with the second insulating film becomes extremely low.

A second insulating film formed in an atmosphere containing an oxidizing gas, which is a main portion of the present invention will be described in detail in the following.

(With Regard to Second Insulating Film)

More specifically, the second insulating film can be materialized by sputtering using $SiO_2$ as a target and using a mixed gas of $O_2$ gas and Ar gas (hereinafter referred to as $O_2$/Ar mixed gas) as a sputtering gas to form an amorphous oxide insulating layer.

The $O_2$/Ar mixing ratio is indicated as [$O_2$-gas flow rate (SCCM)]/[($O_2$-gas flow rate (SCCM))+(Ar-gas flow rate (SCCM))] (vol %). The effect of the $O_2$/Ar mixed gas was recognized when the $O_2$/Ar mixing ratio was 10 vol % or more, and more preferably 50 vol %.

When the $O_2$/Ar mixing ratio was 50 vol %, satisfactory OFF-current characteristics were obtained under almost all oxide semiconductor conditions where satisfactory OFF-current characteristics were obtained when the second insulating film 5 was not formed.

Methods of measuring the oxygen content of amorphous $SiO_x$ as the second insulating film include temperature programmed desorption mass spectrometry (TPD).

Depending on samples, from several ten degrees centigrade to about four hundred degrees centigrade of the temperature of a thermocouple in contact with a surface of the substrate, a peak of desorption of oxygen existing in a thin film is observed.

In the present invention, oxygen was almost desorbed at 400° C. from amorphous $SiO_x$ as the second insulating film (desorbed gas) when measured by temperature programmed desorption mass spectrometry.

The range of measurement temperature used in the quantitative analysis of the thermocouple in contact with a surface of the substrate was 50° C. to 800° C.

The desorbed gas was identified as oxygen from the ionic strength of mass number (m/z) 32, which corresponds to $O2^+$.

Figure 4:
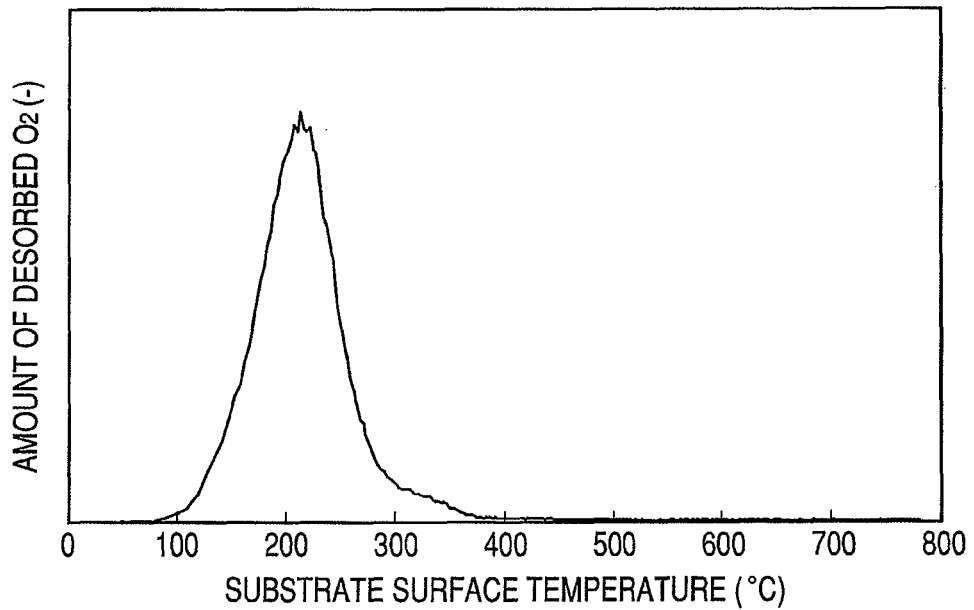
FIG. 4 is a graph illustrating an example of oxygen desorption data of a second insulating film measured by a temperature programmed desorption mass spectrometry.

FIG. 4 is a graph illustrating an example of oxygen desorption data measured by a temperature programmed desorption mass spectrometry.

The amount of oxygen desorbed from amorphous $SiO_x$ as the second insulating film which was obtained in this way was in proportion to the concentration of oxygen in a forming atmosphere.

Figure 5:
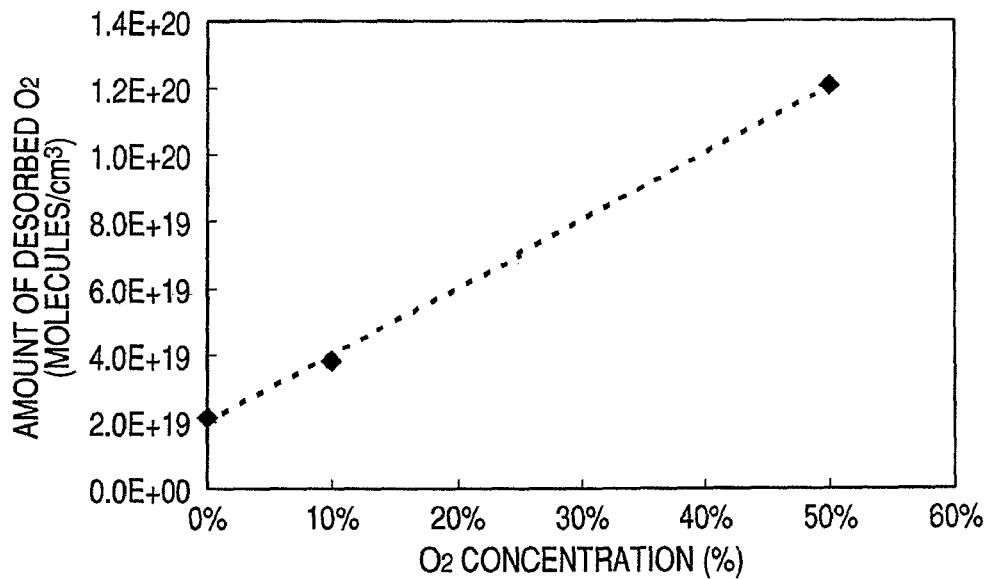
FIG. 5 is a graph illustrating a relationship between an amount of oxygen desorbed from amorphous $SiO_x$ measured by the temperature programmed desorption mass spectrometry and a concentration of $O_2$ gas contained in Ar as a forming atmosphere.

FIG. 5 is a graph illustrating a relationship between the amount of oxygen desorbed from amorphous $SiO_x$ measured by the temperature programmed desorption mass spectrometry and the concentration of $O_2$ gas contained in Ar as the forming atmosphere.

As a result of vigorous research and development of a second insulating film of a TFT using a transparent oxide semiconductor, it was found to use a mixed gas of $O_2$ gas and Ar gas (hereinafter referred to as $O_2$/Ar mixed gas) as sputtering gas (also referred to as sputtering film forming gas) of amorphous $SiO_x$.

Further, it was found that, when the mixing ratio (also referred to as mixing gas ratio) was 10 vol % or more, generation of an oxygen vacancy in the oxide semiconductor was suppressed, and thus, generation of many carrier electrons and a large OFF-current can be prevented.

Amorphous $SiO_x$ which is effective in suppressing generation of an oxygen vacancy was found by temperature programmed desorption mass spectrometry to contain $3.8 \times 10^{19}$ molecules/cm$^3$ or more of oxygen in the film.

Forming conditions which have a wider process margin and which can obtain more stable characteristics are ones when a sputtering gas where the volume ratio of $O_2$ gas to the sum of $O_2$ gas and Ar gas in the sputtering gas ($O_2$/Ar mixing ratio) is 50 vol % is used. When, for example, an oxide semiconductor is formed under such conditions, about $1.2 \times 10^{20}$ molecules/cm$^3$ of oxygen are contained in the film.

It is supposed that the amorphous $SiO_x$ containing oxygen in the film releases the oxygen by unintentional heating during the deposition process (e.g. temperature increase due to input electrical power during the deposition process) or heating in a subsequent process and oxidizes interfacial portions of the oxide semiconductor, whereby suppressing lowering of the resistance. As a result, it is supposed that generation of oxygen vacancies in the oxide semiconductor is suppressed and many carrier electrons are generated, whereby preventing increase of the OFF-current.

According to the findings of the inventors of the present invention, the $O_2$/Ar mixing ratio in the conditions for forming amorphous $SiO_x$ which is effective in suppressing generation of an oxygen vacancy has no upper limit, and even in a case where the ratio of $O_2$ is 100 vol %, generation of an oxygen vacancy is effectively suppressed. However, because the film deposition rate is decreased by increasing the $O_2$/Ar mixing ratio, from the viewpoint of productivity and cost, it is preferable to use an $O_2$/Ar mixing ratio of 50 vol % or less. The relationship between the $O_2$/Ar mixing ratio of the amorphous $SiO_x$ and the film deposition rate is, although depending on film forming parameters such as film forming gas pressure and a distance between the substrate and the target, extremely sensitive to the partial pressure of oxygen. Therefore, normally, forming conditions where the partial pressure of oxygen is high are rarely used. With regard to the forming conditions in this case, with the film deposition rate when the $O_2$/Ar mixing ratio is 0 vol % being the reference value (100%), the film deposition rates when the $O_2$/Ar mixing ratio was 10 vol % and 50 vol % were 77% and 39%, respectively.

Figure 11:
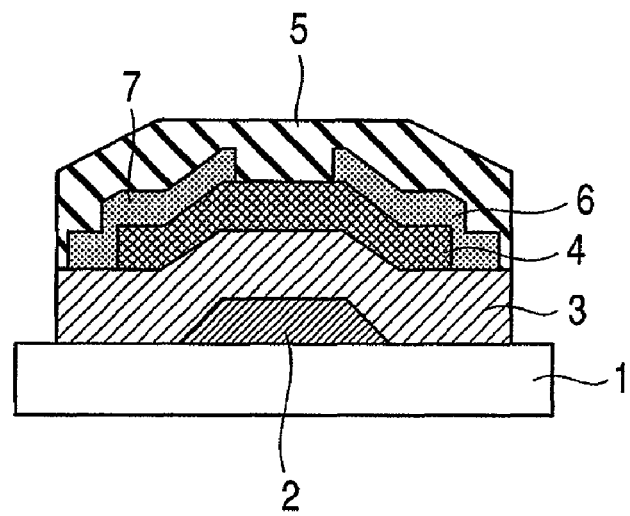
FIG. 11 is a view illustrating a structure of an inverted stagger type TFT having a protective film.

A TFT was produced using the above-described amorphous $SiO_x$ as the second insulating film. The structure of the TFT was as illustrated in FIG. 11, and amorphous InGaZnO as the oxide semiconductor was formed under the same conditions.

At the same time, a TEG device for measuring the conductivity of the oxide semiconductor was produced under the same process conditions, and the conductivity of the oxide semiconductor layer was measured.

$V_{on}$, which is one of the transfer characteristics of the TFT, is the voltage applied to a gate on a rising of the drain current (Id).

Figure 9:
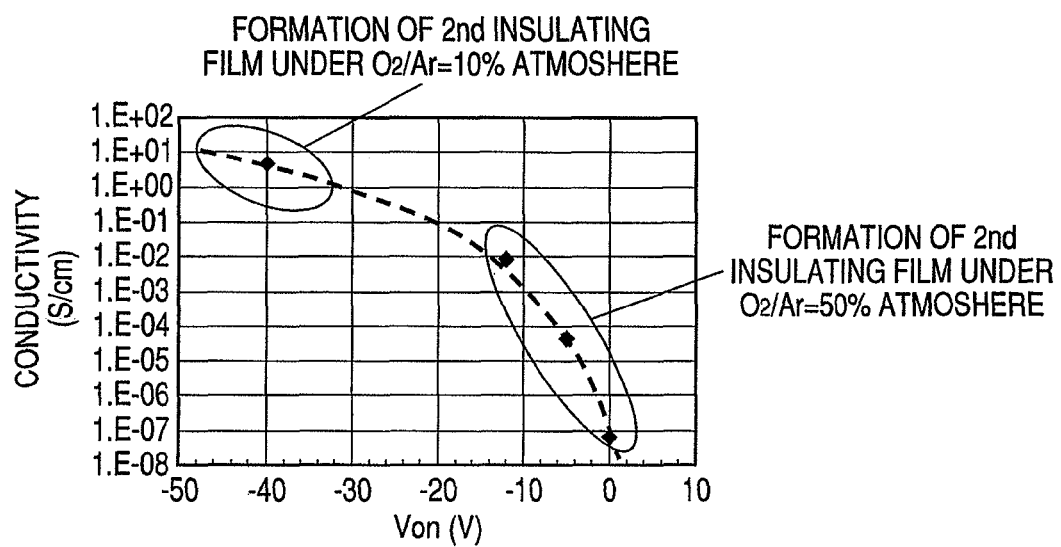
FIG. 9 is a graph illustrating a relationship between $V_{on}$ and conductivity of an oxide semiconductor in an inverted stagger (bottom gate) type MISFET device.

FIG. 9 illustrates a relationship between $V_{on}$ and the conductivity of the oxide semiconductor.

There is a strong correlation between the conductivity of the oxide semiconductor and $V_{on}$. The larger the conductivity of the oxide semiconductor is, the more $V_{on}$ shifts to a negative side. When the conductivity becomes still larger, $V_{on}$ is not observed even at −40 V or less.

As is apparent from the result, when the second insulating film is formed, increase in the conductivity of the oxide semiconductor shifts $V_{on}$, which indicates a border between an OFF-current and an ON current, to the negative side to cause deterioration. As a result, the OFF-current characteristics are deteriorated.

Increase in the conductivity of the oxide semiconductor is suppressed by the forming conditions of the second insulating film.

The suppressing effect is recognized when the $O_2$/Ar mixing ratio is 10 vol % or more, and $3.8 \times 10^{19}$ molecules/cm$^3$ or more of oxygen are contained in the film.

As the second insulating film, amorphous $SiO_x$ which is formed using a sputtering gas whose $O_2$/Ar mixing ratio was 50 vol % and contains $1.2 \times 10^{20}$ molecules/cm$^3$ of oxygen in the film was used. Nine TFTs having the structure illustrated in FIG. 2 were produced, and their TFT characteristics were measured.

Figure 10:
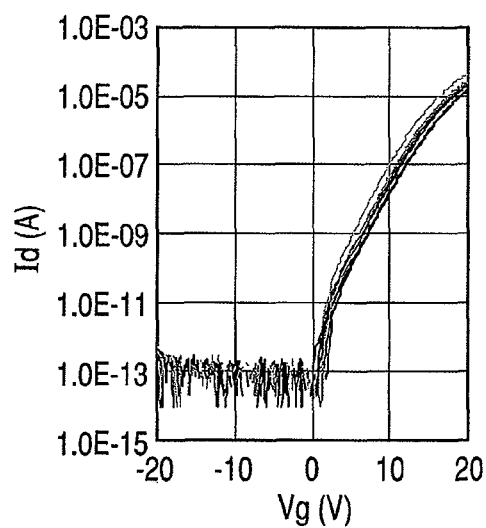
FIG. 10 is a graph illustrating, when nine TFTs having the structure illustrated in FIG. 2 are produced and their TFT characteristics are measured, transfer characteristics of the nine TFTs.

FIG. 10 is a graph illustrating transfer characteristics of the nine TFTs. $V_{on}$ is controlled to be substantially 0 V and TFTs exhibiting satisfactory on/off ratios were obtained.

In the above description, the second insulating film was amorphous $SiO_x$, but amorphous silicon oxynitride or amorphous aluminum oxide may be used as the amorphous oxide insulator as the second insulating film.

Further, a case where an $O_2$/Ar mixed gas was used as the oxidizing gas in forming the second insulating film is described in the above. However, it is essential to form the second insulating film such that the conductivity of the oxide semiconductor is not increased, and thus, the oxidizing gas is not limited to oxygen.

Besides, the conditions for the content of oxygen in the amorphous oxide insulator as the second insulating film are likely to vary depending on a deposition apparatus. However, when varying the deposition parameters to investigate the trend, it is possible to control the content of oxygen so as to obtain the advantageous effect of the present invention. The deposition parameters include deposition gas pressure, input power upon deposition, deposition temperature, substrate-target distance, bias application to the substrate or the cathode, etc.

For example, as the thin film transistor, an amorphous oxide semiconductor layer (a-IGZO thin film) where the composition ratio of indium, gallium, and zinc is 1:1:1 is formed using sputtering which can form a large-area film.

The amorphous oxide semiconductor layer is applied to a thin film transistor having the structure illustrated in FIG. 1.

This can achieve an on/off ratio of the transistor of $10^5$ or more. The field-effect mobility in this case is 1 cm$^2$V$^{-1}$ s$^{-1}$ or more.

By those effects, a source electrode and a drain electrode can be formed by various etching processes in a bottom gate type thin film transistor using an oxide semiconductor, which is excellent in mass productivity.

Further, a thin film transistor having satisfactory transistor characteristics with a minimized OFF-current can be provided.

In the above description, a case where a transparent oxide semiconductor polycrystalline thin film using ZnO as the main component or a transparent oxide semiconductor thin film whose main component is ZnO containing microcrystals is used as the semiconductor layer (channel layer) is described.

Further, a case where an amorphous oxide formed so as to contain In, Ga, Zn, and O is used is described. However, the oxide semiconductor layer is not limited thereto.

As the amorphous oxide semiconductor layer formed so as to contain In, Ga, Zn, and O, an amorphous oxide which contains at least one element among Sn, In, and Zn may be used.

Further, when Sn is selected as at least a part of the elements forming the amorphous oxide, $Sn_{1-x}M4_x$ (0<x<1, M4 is selected from Group IV elements whose atomic numbers are smaller than that of Sn, i.e., Si, Ge, and Zr) may be used instead of Sn.

Further, when In is selected as at least a part of the elements forming the amorphous oxide, $In_{1-y}M3_y$ (0<y<1, M3 is selected from Group III elements whose atomic numbers are smaller than that of Lu or In, i.e., B, Al, Ga, and Y) may be used instead of In.

Further, when Zn is selected as at least a part of the elements forming the amorphous oxide, $Zn_{1-z}M2_z$ (0<z<1, M2 is selected from Group II elements whose atomic numbers are smaller than that of Zn, i.e., Mg and Ca) may be used instead of Zn.

Amorphous materials which can be used include an Sn—In—Zn oxide, an In—Zn—Ga—Mg oxide, an In oxide, an In—Sn oxide, an In—Ga oxide, an In—Zn oxide, a Zn—Ga oxide, and an Sn—In—Zn oxide.

Needless to say, the composition ratio of the forming materials is not necessarily required to be 1:1. It should be noted that, it is difficult for Zn and Sn to form amorphism by themselves in some cases, but adding In makes it easier to form an amorphous phase.

For example, in the case of an In—Zn oxide, the composition is preferably such that the ratio of the number of In atoms to all atoms except oxygen is about 20 at. % or more.

In the case of an Sn—In oxide, the composition is preferably such that the ratio of the number of In atoms to all atoms except oxygen is about 80 at. % or more. In the case of an Sn—In—Zn oxide, the composition is preferably such that the ratio of the number of In atoms to all atoms except oxygen is about 15 at. % or more.

The amorphousness can be confirmed by the condition of not detecting a clear diffraction peak in X-ray diffraction of a thin film to be measured with the angle of incidence being as low as about 0.5 degrees, (that is, a halo pattern is observed).

It should be noted that, in this embodiment, when the above-mentioned materials are used for a channel layer of a field-effect transistor, it is not excluded that the channel layer includes a forming material in a microcrystalline state.

Then, by connecting a drain of the thin film transistor which is an output terminal to an electrode of a display device such as an organic or inorganic electroluminescent (EL) device or liquid crystal device, a display apparatus can be formed.

Specific example of display apparatus structures are described in the following with reference to sectional views of a display apparatus.

Figure 6:
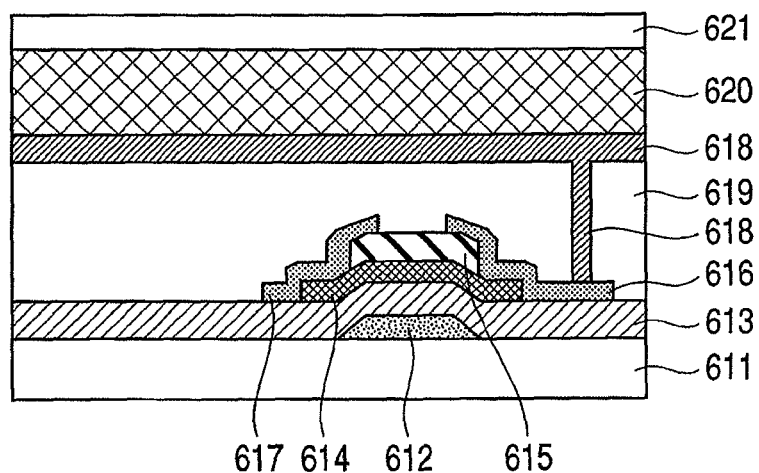
FIG. 6 is a sectional view of an example of a display apparatus as an embodiment of the present invention.

FIG. 6 is a sectional view of an example of a display apparatus as an embodiment of the present invention. A TFT having on a substrate 611 a gate electrode 612, a gate insulating film 613, an oxide semiconductor film 614, a second insulating film 615, a source (drain) electrode 616, and a drain (source) electrode 617.

A pixel electrode 618 is connected via an interlayer insulating film 619 to the drain (source) electrode 617. The pixel electrode 618 is in contact with a light emitting layer 620, and further, the light emitting layer 620 is in contact with an electrode 621.

Such a structure enables to control current injected to the light emitting layer 620 by the value of a current which flows from the source (drain) electrode 616 to the drain (source) electrode 617 via a channel formed in the oxide semiconductor film 614.

Therefore, the current injected to the light emitting layer 620 can be controlled by voltage of the gate 612 of the TFT. In this case, the electrode 618, the light emitting layer 620, and the electrode 621 form an inorganic or organic electroluminescent device as an electro-optical device.

Figure 7:
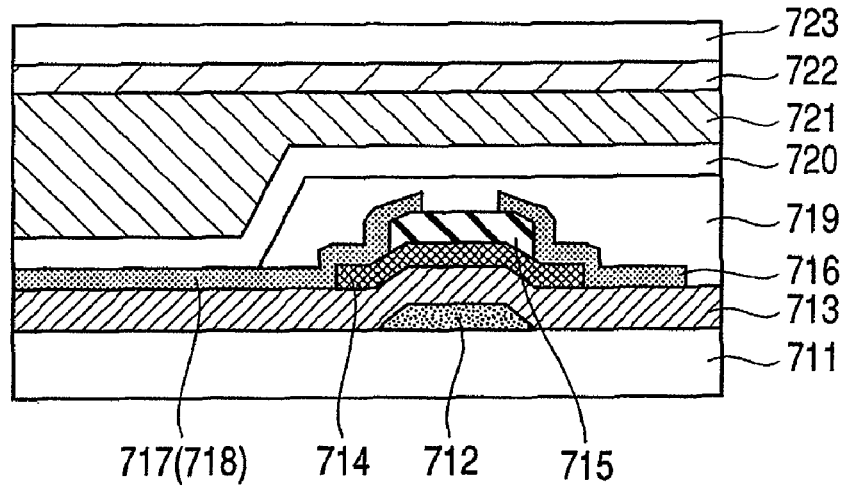
FIG. 7 is a sectional view of an example of another display apparatus as an embodiment of the present invention.

FIG. 7 is a sectional view of another example of a display apparatus as an embodiment of the present invention. A drain (source) electrode 717 is extended so as to serve also as a pixel electrode 718. The drain (source) electrode 717 can be structured to be an electrode 723 for applying voltage to a liquid crystal or an electrophoretic particle 721 sandwiched between high-resistance films 720 and 722.

The liquid crystal or the electrophoretic particle 721, the high-resistance films 720 and 722, the pixel electrode 718, and the electrode 723 form a display device.

Voltage applied to the display device liquid crystal cell or the electrophoretic particle cell as a as an electro-optical device can be controlled by the value of a current which flows from a source electrode 716 to the drain electrode 717 via a channel formed in an oxide semiconductor film 714.

Therefore, the voltage applied to the display device can be controlled by voltage of a gate 712 of the TFT. In this case, if a display medium of the display device is a capsule where a fluid and particles are encapsulated in an insulating film, the high-resistance films 720 and 722 are not necessary.

In the above two examples, the TFT is represented by bottom gate inverted stagger type ones, but the present invention is not necessarily limited to such a structure.

For example, if the connection between the drain electrode which is the output terminal of the TFT and the display device is topologically the same, other structures such as a coplanar type are also possible.

Further, in the above two examples, the pair of electrodes for driving the display device is provided so as to be in parallel with the substrate, but this embodiment is not necessarily limited to such a structure.

For example, if the connection between the drain electrode which is the output terminal of the TFT and the display device is topologically the same, either one or both of the electrodes may be provided so as to be perpendicular to the substrate.

Further, in the above two examples, only one TFT connected to the display device is illustrated, but the present invention is not necessarily limited to such a structure. For example, the TFT illustrated in the figures may be connected to another TFT according to the present invention. What is required is that the TFT illustrated in the figures is in a final stage of a circuit including those TFTs.

In this case, when the pair of electrodes for driving the display device is provided so as to be in parallel with the substrate, if the display device is an EL device or a reflection type display device such as a reflection type liquid crystal device, either one of the electrodes is required to be transparent to the wavelength of the emitted light or the wavelength of the reflected light.

If the display device is a transmission type display device such as a transmission type liquid crystal device, both of the electrodes are required to be transparent to transmitted light.

Further, in the TFTs according to this embodiment, all the structure may be transparent, which enables to form a transparent display device.

Further, such a display device may be provided on a low heat resistant substrate such as a lightweight, flexible, and transparent plastic substrate made of resin.

Next, a display apparatus where pixels including an EL device (in this case, an organic EL device) and a thin film transistor are arranged two-dimensionally (in a two-dimensional state) is described with reference to FIG. 8.

Figure 8:
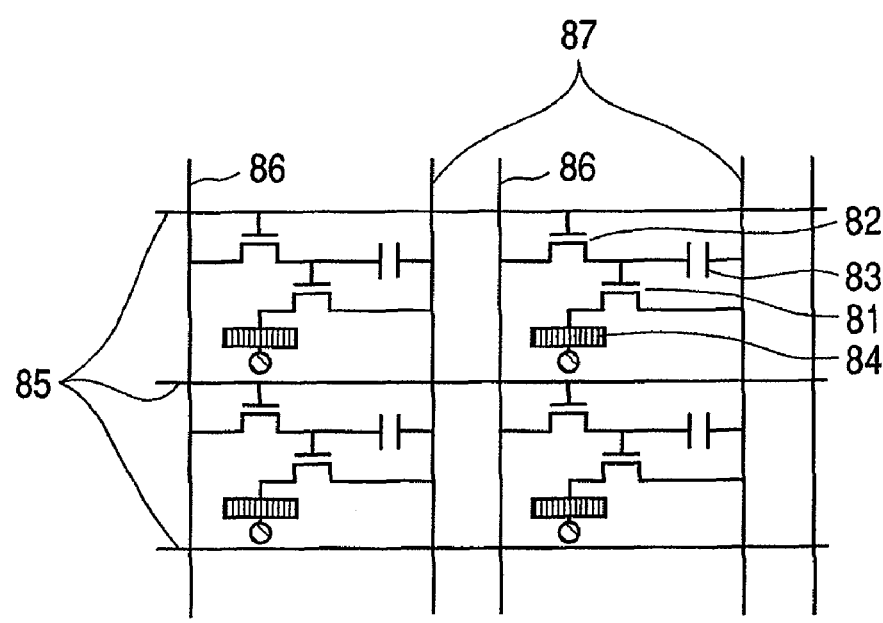
FIG. 8 is a view illustrating a structure of a display apparatus where pixels including an organic EL device and a thin film transistor are arranged two-dimensionally (in a two-dimensional state).

FIG. 8 illustrates a transistor 81 for driving an organic EL layer 84, a transistor 82 for selecting a pixel.

A capacitor 83 is for the purpose of maintaining the selected state and stores charge between a common electrode line 87 and a source of a transistor 2 to maintain a gate signal of a transistor 1.

Pixel selection is made by a scanning electrode line 85 and a signal electrode line 86.

More specifically, an image signal is applied as a pulse signal from a driver circuit (not shown) via the scanning electrode 85 to a gate electrode.

At the same time, the image signal is applied also as a pulse signal from another driver circuit (not shown) via a signal electrode 86 to the transistor 82 to select a pixel.

In this case, the transistor 82 is turned ON and charge is stored in the capacitor 83 between the signal electrode line 86 and a source of the transistor 82.

This makes gate voltage of a transistor 81 maintained at a desired level and the transistor 81 is turned ON. This state is maintained until the next signal is received.

During the state where the transistor 81 is ON, voltage and current are kept supplied to the organic EL layer 84 to maintain light emission.

In the example illustrated in FIG. 8, two transistors and one capacitor are provided per pixel, but more transistors or the like may be mounted in order to improve the performance.

It is essential to use in a transistor portion a TFT containing In, Ga, Zn, and O which can be formed at a low temperature and which is a transparent TFT to obtain an effective EL device.

Next, examples of the present invention will be described with reference to the drawings.

Example 1

In this example, an inverted stagger (bottom gate) type MISFET device illustrated in FIG. 11 is produced.

First, a gate terminal of Ti of 5 nm/Au of 40 nm/Ti of 5 nm is formed on a glass substrate by photolithography and a lift-off technique.

Further, an insulating layer of a-$SiO_x$ with a thickness of 200 nm is formed thereon by sputtering. In this case, a $SiO_2$ target is used as the sputtering target, and Ar gas is used as the sputtering gas. Also the RF radio-frequency power is 400 W, the deposition pressure is 0.1 Pa, and the film deposition rate is 7.4 nm/min. The substrate temperature is room temperature, and no intentional heating is performed.

Further, an amorphous oxide semiconductor film used as a semiconductor layer is formed thereon at room temperature with a thickness of 20 nm by an RF sputtering.

A channel region is formed by photolithography and wet etching using hydrochloric acid.

After that, Ti of 5 nm/Au of 40 nm/Ti of 5 nm is formed by electron beam deposition, and source and drain terminals are formed by photolithography and a lift-off technique.

Further, as a second insulating film, an insulating layer of a-$SiO_x$ is formed with a thickness of 100 nm by an RF sputtering.

In this case, $SiO_2$ is used as the target and an oxidizing atmosphere whose $O_2$/Ar mixing ratio is 50 vol % (5 SCCM O$_2$ gas and 5 SCCM Ar gas) is used as the sputtering gas. Also the RF radio-frequency power is 400 W, the deposition pressure is 0.1 Pa, and the film deposition rate is 2.9 nm/min. The substrate temperature is room temperature, and no intentional heating is performed.

In this way, nine inverted stagger (bottom gate) type MISFET devices as illustrated in FIG. 11 are completed. In this case, the metal composition ratio in the amorphous oxide semiconductor film is In:Ga:Zn=1.00:0.94:0.65.

Figure 12:
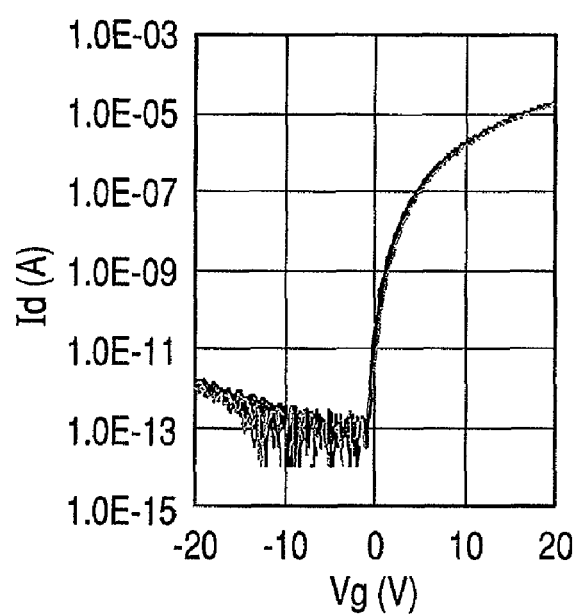
FIG. 12 is a graph illustrating, when nine TFTs having the structure illustrated in FIG. 11 are produced and their TFT characteristics are measured, transfer characteristics of the nine TFTs.

As a result of an evaluation of I-V characteristics of the MISFET device, the nine TFTs has a field-effect mobility of 5.0 cm$^2$/Vs on average and an on/off ratio of more than 10$^6$ on average. FIG. 12 illustrates the transfer characteristics.

By using the second insulating film according to the present invention, an OFF-current of the oxide semiconductor bottom gate type thin film transistor is minimized and thus a thin film transistor having satisfactory transistor characteristics can be produced with stability.

Comparative Example 1

In this comparative example, an inverted stagger (bottom gate) type MISFET device illustrated in FIG. 11 is produced under the same conditions as those of Example 1 except for the forming conditions of the second insulating film.

As a second insulating film, an insulating layer of a-SiO$_x$ is formed with a thickness of 100 nm by a RF sputtering. In this case, SiO$_2$ is used as the target and an oxidizing atmosphere whose O$_2$/Ar mixing ratio was 10 vol % (1 SCCM O$_2$ gas and 5 SCCM Ar gas) is used as the sputtering gas. Also the RF radio-frequency power is 400 W, the deposition pressure is 0.1 Pa, and the film deposition rate is 5.7 nm/min. The substrate temperature is room temperature, and no intentional heating is performed. In this way, nine inverted stagger (bottom gate) type MISFET devices as illustrated in FIG. 11 are completed.

At the same time, a TEG device for measuring the conductivity of the oxide semiconductor is produced under the same process conditions, and the conductivity of the oxide semiconductor layer is measured.

V$_{on}$ s, one of the transfer characteristics of the TFT, is the voltage applied to a gate on a rising of the drain current (Id).

FIG. 9 illustrates a relationship between V$_{on}$ and the conductivity of the oxide semiconductor.

The second insulating film of a-SiO$_x$ formed by using the sputtering gas of the O$_2$/Ar mixing ratio of 10 vol % contains 3.8×10$^{19}$ molecules/cm$^3$ of oxygen therein.

As a result, the second insulating film of a-SiO$_x$ formed by using the gas of the O$_2$/Ar mixing ratio of 10 vol % is effective in suppressing generation of an oxygen vacancy in the oxide semiconductor, V$_{on}$ thereof is −40 V on average, and the on/off ratio thereof is 10$^6$ or more, which is satisfactory.

When the O$_2$/Ar mixing ratio is 1 vol % or 0 vol %, variations in the characteristics increase and, even if gate voltage of −50 V is applied, clear V$_{on}$ is not observed in some cases and clear effect of suppressing generation of an oxygen vacancy in the oxide semiconductor is not recognized.

Example 2

In this example, an inverted stagger (bottom gate) type MISFET device illustrated in FIG. 1 is produced.

First, a gate electrode layer of a transparent conductive film IZO with a thickness of 150 nm is formed on a glass substrate by sputtering.

A gate electrode is formed by photolithography and wet etching using hydrochloric acid.

Further, an insulating layer of a-SiO$_x$ with a thickness of 200 nm is formed thereon by an RF sputtering. In this case, a SiO$_2$ target is used as the sputtering target, and Ar gas is used as the sputtering gas. Also the RF radio-frequency power is 400 W, the deposition pressure is 0.1 Pa, and the film deposition rate is 7.4 nm/min. The substrate temperature is room temperature, and no intentional heating is performed.

Further, an amorphous oxide semiconductor film used as a semiconductor layer is formed at room temperature with a thickness of 20 nm by sputtering.

A channel region is formed by photolithography and wet etching using hydrochloric acid. After that, as a second insulating film, an insulating layer of a-SiO$_x$ is formed with a thickness of 100 nm by sputtering.

In this case, SiO$_2$ is used as the target and an oxidizing atmosphere whose O$_2$/Ar mixing ratio is 50 vol % (5 SCCM O$_2$ gas and 5 SCCM Ar gas) is used as the sputtering gas.

A second insulating film which protects the channel region and functions as an etching stop layer is completed by photolithography and dry etching using a CF$_4$ gas.

After that, a transparent conductive film ITO is formed with a thickness of 150 nm by sputtering, and source and drain terminals are formed by photolithography and etching.

In this way, the inverted stagger (bottom gate) type transparent MISFET device illustrated in FIG. 1 can be formed.

As the source electrode and the drain electrode, not only a transparent conductive oxide film such as IZO, but also a metal such as Ni, Cr, Rh, Mo, Nd, Ti, W, Ta, Pb, or Al, an alloy thereof, or a silicide thereof may be used. Further, the source electrode and the drain electrode may be formed of materials different from each other.

The source electrode and the drain electrode of the inverted stagger (bottom gate) type MISFET device can be formed by etching, and a thin film transistor which excels in mass production and has transistor characteristics with a minimized OFF-current is formed.

Example 3

In this example, a display apparatus using the TFT illustrated in FIG. 7 is described.

The production process of the TFT is similar to that of Example 3.

In the above-described TFT, a short side of an ITO film forming a drain electrode is extended to 100 μm. With 90 μm of the extended portion being left and with wiring to the source electrode and the gate electrode being secured, the TFT is covered with an insulating layer.

A polyimide film is applied thereon and rubbing is carried out.

On the other hand, a plastic substrate having an ITO film and a polyimide film similarly formed thereon with rubbing carried out is prepared, the plastic substrate is opposed to the above-described substrate having the TFT formed thereon with a gap of 5 μm therebetween, and nematic liquid crystal is injected into the gap.

Further, a pair of polarizing plates is provided on both sides of the structure.

In this case, by applying voltage to the source electrode of the TFT and changing voltage applied to the gate electrode, light transmission is changed only with regard to a region of 30 μm×90 μm which is a part of the island of the ITO film extended from the drain electrode.

Further, the light transmission can be continuously changed also by the source-drain voltage under the gate voltage where the TFT is ON. In this way, a display apparatus using a liquid crystal cell corresponding to FIG. 7 as a display device is formed.

In this example, a white plastic substrate is used as a substrate for forming the TFT, gold replaces the respective electrodes of the TFT, and the polyimide film and the polarizing plates were omitted.

Further, the gap between the white and transparent plastic substrates is filled with a capsule where particles and a fluid are encapsulated with an insulating film filled.

In the display apparatus structured in this way, the voltage between the drain electrode extended by the TFT and the ITO film thereabove is controlled, and thus, the particles in the capsule moves up and down.

This enables to carry out a display by controlling the reflectivity of the extended drain electrode region observed from the side of the transparent substrate.

Further, in this example, a plurality of adjacent TFTs may be formed to form, for example, a current control circuit having an ordinary structure with four transistors and a capacitor, and, one of the transistors in a final stage may drive an EL device as the TFT illustrated in FIG. 6.

For example, a TFT using the above-described ITO film as a drain electrode is used.

An organic electroluminescence device formed of a charge injection layer and a light emitting layer is formed in a region of 30 μm×90 μm which is a part of the island of the ITO film extended from the drain electrode.

In this way, a display apparatus using an EL device can be formed.

Example 4

The display device and the TFT of Example 3 are arranged two-dimensionally.

For example, 7,425×1,790 pixels each occupying an area of about 30 μm×115 μm including a display device such as a liquid crystal cell or an EL device of Example 3 and a TFT are arranged so as to form a rectangle with a pitch of 40 μm in the direction of a short side and 120 μm in the direction of a long side.

1,790 gate wirings going through gate electrodes of 7,425 TFTs in the direction of the long side and 7,425 signal wires going through portions of source electrodes of 1,790 TFTs extending off out of the island of an amorphous oxide semiconductor film by 5 μm in the direction of the short side are provided.

The gate wirings and the signal wirings are connected to a gate driver circuit and a source driver circuit, respectively.

Further, in the case of a liquid crystal display device, by providing on a surface a color filter having repeated RGB in the direction of the long side in such a manner that its size is the same as that of the liquid crystal display device and it is aligned with the liquid crystal display device, an active matrix color image display apparatus of A4-size with about 211 ppi can be formed.

In the case of an EL device, a gate electrode of a first TFT of two TFTs included in one EL device is connected to a gate wiring, a source electrode of a second TFT is connected to a signal wiring, and further, the emitting wavelengths of the EL device are repeated in the direction of the long side with RGB.

In this way, a self-emission type color image display apparatus having the same resolution can be formed.

In such a case, the driver circuit for driving the active matrix may be formed by using the same TFT as that of a pixel according to the present invention, or may be formed by using an available IC chip.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-328308, filed Dec. 5, 2006 and 2007-273863, filed Oct. 22, 2007, which are hereby incorporated by reference in their entirety.

The invention claimed is:

1. A bottom gate type thin film transistor, comprising on a substrate:
   a gate electrode:
   a first insulating film as a gate insulating film;
   an oxide semiconductor layer as a channel layer;
   a second insulating film as a protective layer;
   a source electrode; and
   a drain electrode,
   wherein the oxide semiconductor layer comprises an oxide including at least one of In, Zn, and Sn,
   wherein the second insulating film is formed using an oxide including at least one of Si and Al as a sputtering target, and a sputtering gas with an oxygen concentration of 10 vol % or more and 50 vol % or less; and
   wherein the second insulating film is formed so as to contain therein $3.8 \times 10^{19}$ molecules/cm$^3$ or more of a desorbed gas observed as oxygen by temperature programmed desorption mass spectrometry.

2. The bottom gate type thin film transistor according to claim 1, wherein the oxide semiconductor layer comprises an amorphous oxide including In, Zn, and Ga.

3. The bottom gate type thin film transistor according to claim 1, wherein the desorbed gas observed as oxygen is a desorbed gas by temperature programmed desorption mass spectrometry in the case where the temperature of the surface of the substrate is heated from 50° C. to 800° C.

4. An apparatus, comprising:
   an electro-optical device having a pixel electrode; and
   the bottom gate type thin film transistor according to claim 1,
   wherein said pixel electrode is connected to one of the source electrode and the drain electrode of the bottom gate type thin film transistor.

5. The apparatus according to claim 4, wherein the electro-optical device is an electroluminescence device.

6. The apparatus according to claim 4, wherein the electro-optical device is a liquid crystal cell.

7. The apparatus according to claim 4, wherein a plurality of the electro-optical devices and a plurality of the bottom gate type thin film transistors are arranged two-dimensionally on a substrate.

8. A method of manufacturing a bottom gate type thin film transistor, the transistor comprising on a substrate a gate electrode, a first insulating film as a gate insulating film, an oxide semiconductor layer as a channel layer, a second insulating film as a protective layer, a source electrode, and a drain electrode, the method comprising the steps of:
   forming the gate electrode on the substrate;
   forming the first insulating film and the oxide semiconductor layer in the stated order;
   patterning the first insulating film and the oxide semiconductor layer;
   forming the second insulating film by sputtering in an atmosphere including an oxidizing gas;

patterning the second insulating film so as to cover at least a part of a channel region of the oxide semiconductor layer;

forming the source electrode and the drain electrode; and patterning the source electrode and the drain electrode using the second insulating film as an etching stopper, wherein the step of forming the second insulating film uses an oxide including at least one of Si and Al as a sputtering target, and a sputtering gas with an oxygen concentration of 10 vol % or more and 50 vol % or less; and wherein the second insulating film is formed so as to contain therein $3.8 \times 10^{19}$ molecules/cm$^3$ or more of a desorbed gas observed as oxygen by temperature programmed desorption mass spectrometry.

9. The method according to claim 8, wherein the step of forming the oxide semiconductor layer, the first and second insulating film, and the gate electrode, source electrode and drain electrode are performed at room temperature.

10. The method according to claim 8, wherein the oxygen is a desorbed gas observed as oxygen by temperature programmed desorption mass spectrometry in the case where the temperature of the surface of the substrate is heated from 50° C. to 800° C.

* * * * *